United States Patent
Correale, Jr. et al.

(10) Patent No.: US 7,290,226 B2
(45) Date of Patent: Oct. 30, 2007

(54) VIA REDUNDANCY BASED ON SUBNET TIMING INFORMATION, TARGET VIA DISTANT ALONG PATH FROM SOURCE AND/OR TARGET VIA NET/SUBNET CHARACTERISTIC

(75) Inventors: Anthony Correale, Jr., Raleigh, NC (US); Lewis W. Dewey, III, Wappingers Falls, NY (US); Jason D. Hibbeler, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 10/907,496

(22) Filed: Apr. 4, 2005

(65) Prior Publication Data
US 2006/0225005 A1 Oct. 5, 2006

(51) Int. Cl.
G06F 17/50 (2006.01)
G06F 9/45 (2006.01)

(52) U.S. Cl. .................. 716/2; 716/6; 716/12
(58) Field of Classification Search .......... 716/1, 716/2, 6, 12
See application file for complete search history.

(56) References Cited

U.S. PATENT DOCUMENTS

| | | | |
|---|---|---|---|
| 5,155,302 A | | 10/1992 | Nguyen |
| 5,483,461 A | | 1/1996 | Lee et al. |
| 5,544,088 A | | 8/1996 | Aubertine et al. |
| 5,798,937 A | * | 8/1998 | Bracha et al. ............. 716/9 |
| 6,026,224 A | * | 2/2000 | Darden et al. ............. 716/10 |
| 6,480,991 B1 | | 11/2002 | Cho et al. |
| 6,662,351 B2 | | 12/2003 | Kitamura et al. |
| 6,715,133 B2 | * | 3/2004 | Brennan ..................... 716/2 |
| 6,804,808 B2 | * | 10/2004 | Li et al. .................... 716/5 |
| 2005/0048677 A1 | | 3/2005 | Allen et al. |
| 2005/0234684 A1 | * | 10/2005 | Sawicki et al. ............ 703/1 |
| 2006/0064653 A1 | * | 3/2006 | Zhang et al. ............. 716/2 |
| 2006/0101367 A1 | * | 5/2006 | Fujita et al. ............. 716/10 |

OTHER PUBLICATIONS

Yingmeng, L. et al., "A Via Minimization Algorithm for VLSI 2-Layer Routing," Chinese Journal of Semiconductors, vol. 10, No. 1, Jan. 1989. pp. 117-125.

* cited by examiner

Primary Examiner—Jack Chiang
Assistant Examiner—Magid Y. Dimyan
(74) Attorney, Agent, or Firm—Richard M. Kotulak; Hoffman, Warnick & D'Alessandro LLC (57) ABSTRACT

Methods, systems and program products are disclosed that prioritize each target via for via redundancy based on at least one of the following: subnet timing information, a distance of a target via along a path from a driving source and a target via net/subnet characteristic, and attempt to add a redundant via to each target via based on the prioritization. The invention improves overall yield and reduces timing sensitivity to AC-related defects.

17 Claims, 6 Drawing Sheets

Bin 1:
Target via 1234    Weight: 1000
Target via 4321    Weight: 900
Target via 6543    Weight: 850

Bin 2:
Target via 5678    Weight: 750
Target via 0987    Weight: 700
Target via 7890    Weight: 650

Bin 3:
Target via 3456    Weight: 600
Target via 2345    Weight: 600
Target via 5678    Weight: 500

Bin 4:
Target via 7654    Weight: 200
Target via 8901    Weight: 30
Target via 0013    Weight: 10

VIA REDUNDANCY BASED ON SUBNET TIMING INFORMATION, TARGET VIA DISTANT ALONG PATH FROM SOURCE AND/OR TARGET VIA NET/SUBNET CHARACTERISTIC

BACKGROUND OF THE INVENTION

1. Technical Field

The present invention relates generally to integrated circuit design, and more particularly, to via redundancy based on subnet timing information, a distance of a target via along path from a driving source and/or target via net/subnet characteristic.

2. Related Art

In the semiconductor chip manufacturing industry, defects on silicon products are often difficult to detect and can result in the shipment of products with hidden defects that can result in product failures. A "via" is a hole etched in an interlayer dielectric that is then filled with metal to provide a vertical connection between stacked up interconnect metal lines in a semiconductor chip. Vias are a major cause of yield problems. In terms of detecting problems with vias, some problems are generally easy to detect, such as a totally open via, i.e., one causing an open circuit. Other problems, however, are harder to detect. For example, a partially open via or one having resistance significantly higher than desired is very difficult to detect.

In order to improve yield, via redundancy is usually employed where possible, i.e., where area and layout groundrules permit. However, space in layouts is limited, and it is not always possible to add a redundant via to a given original via. A challenge that the limited number of via redundancy implementations presents is that some problem vias affect performance more than others. Vias having a higher resistance than a desired resistance are particularly challenging. For example, high-resistance vias at the end or destination of a net have significantly less impact on performance. In contrast, high-resistance vias at the beginning or source of a net typically affect performance degradation more than others because of the resistance-capacitance (RC) effects, i.e., delay imposed on nets because of the resistance and capacitance associated with the wires and vias that make up the net, imposed on the nets in question. Unfortunately, conventional post-routing via redundancy algorithms approach each via on a first-come-first-served basis without any regard for its relative importance to the overall system. As a result, if a first via is duplicated and a second via is more significant to performance, but the second via cannot have a redundant mate because the first via's redundant mate is in the way, a defect caused by the second via is allowed to exceedingly affect performance.

In another approach, disclosed in U.S. Pat. No. 6,715,133, redundant vias are prioritized based on which via more current must flow to charge or discharge capacitance. In one form, this approach prioritizes target vias based on an arbitrary counter relative to a source, which is not as accurate as actual distance from the source. In addition, this approach ignores clock nets and does not allow for subnet evaluation, each of which makes the evaluation not fully comprehensive.

In view of the foregoing, there is a need in the art for an intelligent algorithm that weighs the importance of a redundant via relative to subnet timing information, a distance of a target via along a path from a driving source and net characteristics, and uses that information as it adds redundant vias.

SUMMARY OF THE INVENTION

The invention includes methods, systems and program products that prioritize each target via for via redundancy based on at least one of subnet timing information, a distance of a target via along a path from a driving source and a target via net/subnet characteristic, and attempt to add a redundant via to each target via based on the prioritization. The invention improves overall yield and reduces timing sensitivity to AC-related defects.

A first aspect of the invention includes a method of adding via redundancy within an integrated circuit (IC) design, the method comprising the steps of: identifying a plurality of target vias by determining which vias in the IC design do not have a redundant via; prioritizing each target via based on at least one of the following: subnet timing information, a distance of a target via along a path from a driving source and a target via net/subnet characteristic; and attempting to add a redundant via to each target via based on the prioritization A second aspect of the invention is directed to a system for adding via redundancy within an integrated circuit (IC) design, the system comprising: means for identifying a plurality of target vias within the IC design by determining which vias do not have a redundant via; means for prioritizing each target via based on at least one of the following: subnet timing information, distance of a target via along a path from a driving source and a target via net/subnet characteristic; and means for attempting to add a redundant via to each target via based on the prioritization.

A third aspect of the invention is related to a program storage device readable by a machine, tangibly embodying a program of instructions executable by the machine to perform a method for adding via redundancy within an integrated circuit (IC) design, the method comprising: identifying a plurality of target vias in the IC design by determining which vias do not have a redundant via; prioritizing each target via based on at least one of the following: subnet timing information, a distance of a target via along a path from a driving source and a target via net/subnet characteristic; and attempting to add a redundant via to each target via based on the prioritization The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
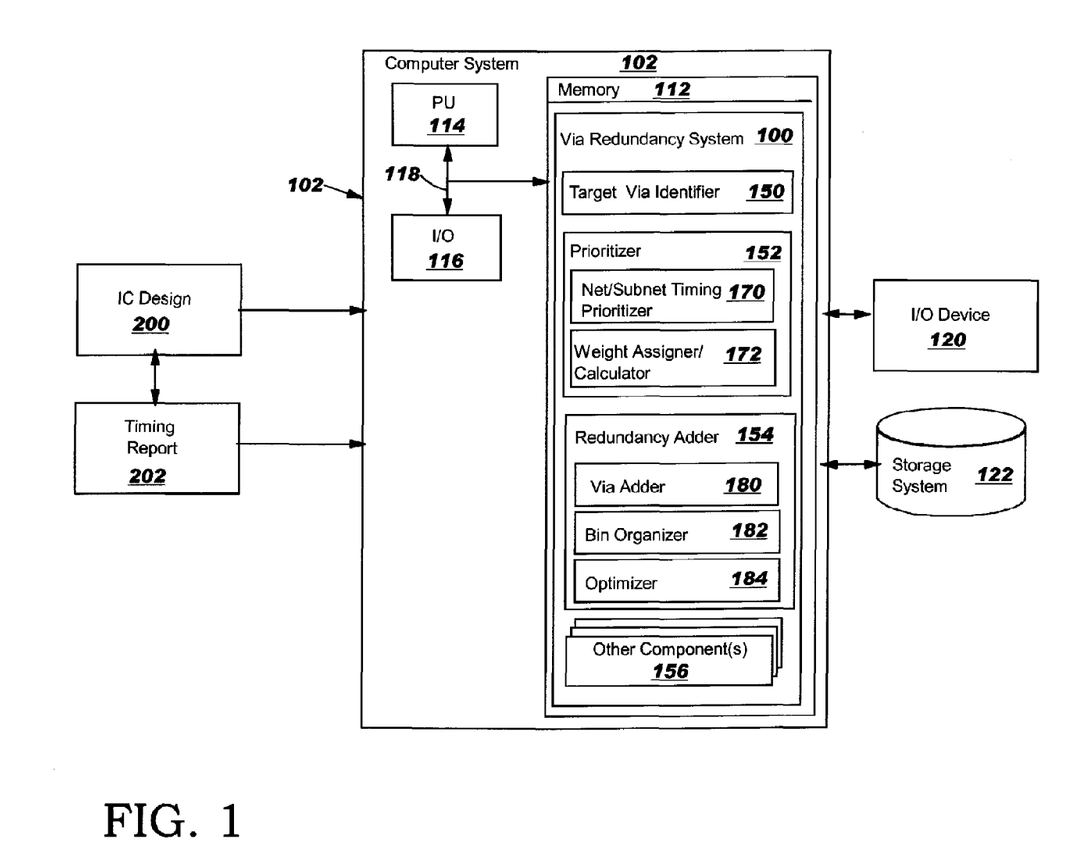
FIG. 1 shows a block diagram of a via redundancy system according to the invention.

With reference to the accompanying drawings, FIG. 1 is a block diagram of a via redundancy system 100 in accordance with the invention. System 100 is shown implemented on computer system 102 as computer program code. To this extent, computer system 102 is shown including a memory 112, a processing unit 114, an input/output (I/O) interface 116, and a bus 118. Further, computer system 102 is shown in communication with an external I/O device/resource 120 and a storage system 122. In general, processing unit 114 executes computer program code, such as system 100, that is stored in memory 112 and/or storage system 122. While executing computer program code, processing unit 114 can read and/or write data to/from memory 112, storage system 122, and/or I/O device 120. Bus 118 provides a communication link between each of the components in computer system 102, and I/O device 120 can comprise any device that enables a user to interact with computer system 102 (e.g., keyboard, pointing device, display, etc.).

Alternatively, a user can interact with another computing device (not shown) in communication with computer system 102. In this case, I/O interface 116 can comprise any device that enables computer system 102 to communicate with one or more other computing devices over a network (e.g., a network system, network adapter, I/O port, modem, etc.). The network can comprise any combination of various types of communications links. For example, the network can comprise addressable connections that may utilize any combination of wired and/or wireless transmission methods. In this instance, the computing devices (e.g., computer system 102) may utilize conventional network connectivity, such as Token Ring, Ethernet, WiFi or other conventional communications standards. Further, the network can comprise one or more of any type of network, including the Internet, a wide area network (WAN), a local area network (LAN), a virtual private network (VPN), etc. Where communications occur via the Internet, connectivity could be provided by conventional TCP/IP sockets-based protocol, and a computing device could utilize an Internet service provider to establish connectivity to the Internet.

Computer system 102 is only representative of various possible combinations of hardware and software. For example, processing unit 114 may comprise a single processing unit, or be distributed across one or more processing units in one or more locations, e.g., on a client and server. Similarly, memory 112 and/or storage system 122 may reside at one or more physical locations. Memory 112 and/or storage system 122 can comprise any combination of various types of computer-readable media and/or transmission media including magnetic media, optical media, random access memory (RAM), read only memory (ROM), a data object, etc. I/O interface 116 can comprise any system for exchanging information with one or more I/O devices. Further, it is understood that one or more additional components (e.g., system software, math co-processing unit, etc.) not shown in FIG. 1 can be included in computer system 102. To this extent, computer system 102 can comprise any type of computing device such as a network server, a desktop computer, a laptop, a handheld device, a mobile phone, a pager, a personal data assistant, etc. However, if computer system 102 comprises a handheld device or the like, it is understood that one or more I/O devices (e.g., a display) and/or storage system 122 could be contained within computer system 102, not externally as shown.

As discussed further below, via redundancy system 100 is shown including a target via identifier 150, a prioritizer 152, a redundancy adder 154, and other system components 156. Prioritizer 152 includes a net/subnet timing prioritizer 170 and a weight assigner/calculator 172. Redundancy adder 154 includes a via adder 180, a bin organizer 182 and an optimizer 184. Other system components 156 may include any other functionality necessary for operation, but not expressly described below.

As shown in FIG. 1, via redundancy system 100 receives an integrated circuit (IC) design 200 from any now known or later developed design system. IC design 200 has had placement, routing and timing analysis completed thereon. A timing system report 202 is also provided to via redundancy system 100. Timing report 202 includes a detailed timing report, which describes the slack amount, i.e., the amount of cycle time that is in excess of what is needed for each net and/or subnet of IC design 200. A "net" is an electrical path in a circuit—through wires and vias—from a source to a destination; and a "subnet" is part of a net. Timing report 202 lists each net and/or subnet by criticality in terms of slack amount, i.e., the criticality of a net and/or subnet to the system, relative to other nets or subnet in the system in terms of slack amount.

Figure 2:
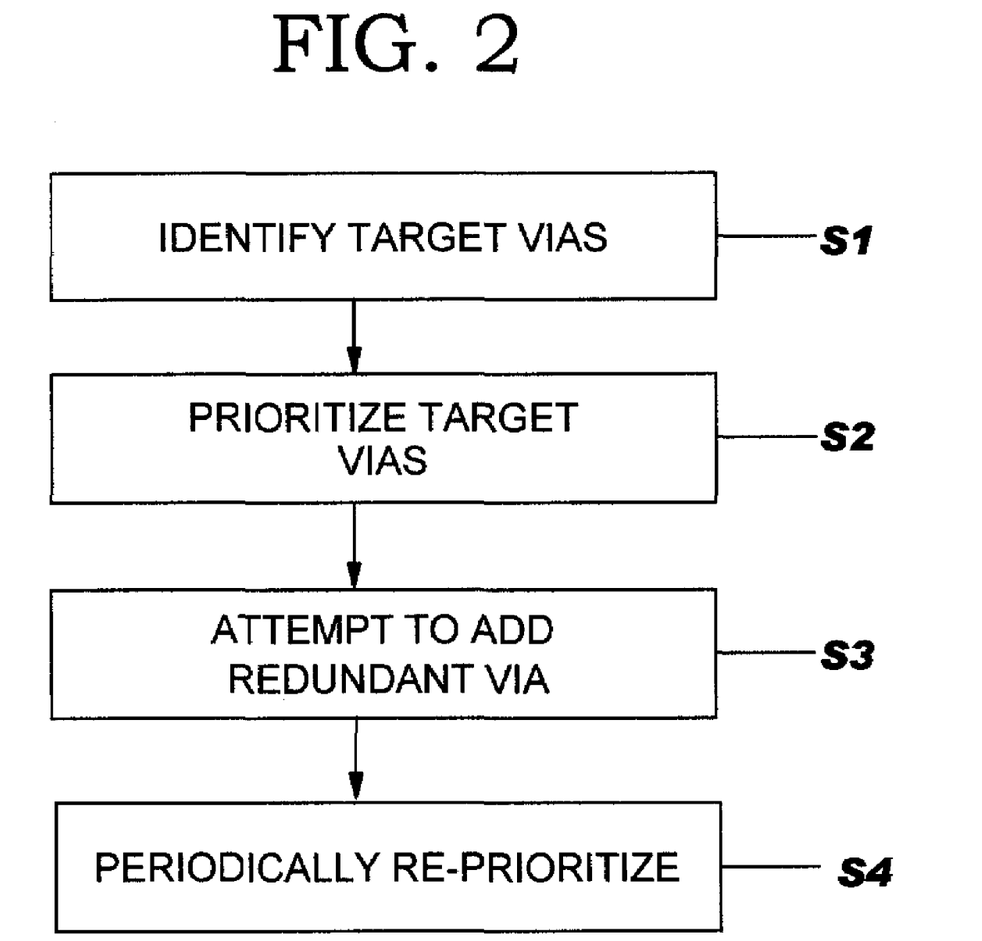
FIG. 2 shows a flow diagram of one embodiment of an operational methodology of the system of FIG. 1.
Figure 3:
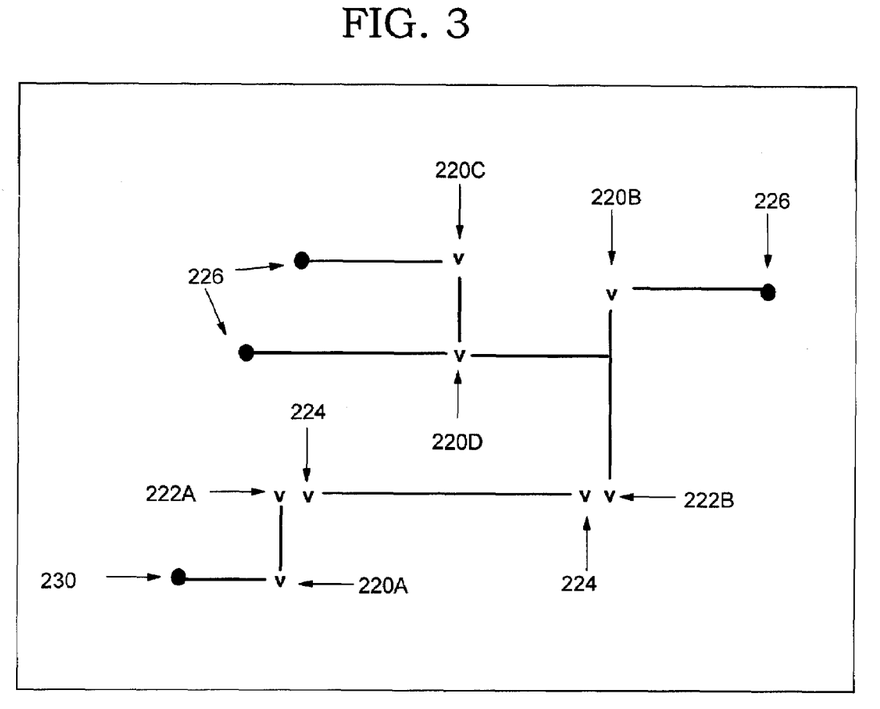
FIG. 3 shows a plan view of a net including subnets of an illustrative IC design.

Turning to FIG. 2, a flow diagram of one embodiment of an operational methodology for adding via redundancy using via redundancy system 100 will now be described in conjunction with FIG. 1. FIG. 3 shows a simplified illustrative IC design layer for description of the invention. The flow diagram of FIG. 2 will now be described in conjunction with FIGS. 1 and 3.

In a first step S1, target vias 220A-D are identified by target via identifier 150 by determining which vias 220A-D, 222A-B do not have a redundant via 224. That is, "target vias" are those vias 220A-D not already including a redundant via 224. Target via identifier 150 may employ any now known or later developed technique for identifying target vias 220A-D, e.g., a scanline algorithm. The subnet containing single target via 220D has a smaller slack value than the subnet containing via 220B, so the weight computation for target via 220D would use a smaller slack value than would the weight computation for target via 220B. As a result, based solely on subnet slack, target via 220D would have a higher priority than target via 220B.

In step S2, each target via 220A-D is prioritized by prioritizer 152 based on at least one of subnet timing information, a distance of a target via along a path from a driving source and a target via net/subnet characteristic.

"Subnet timing information" may include, but is not limited to: a slack amount for the target via's subnet or a "path-based" slack. In the latter case, different subnets within a given net may have different slack values. "Distance of a target via along a path from a driving source" may include, but is not limited to, a geographic distance along a path within the net or subnet of a target via 220A-D from driving source 230. A "driving source" 230 is a beginning of a net. The ends of the subnets, or sinks, 226 are also shown in FIG. 3. It should be recognized that a driving source 230 can be provided at practically any location on a layer of an IC design. As stated above, in one embodiment, prioritization is based solely on a distance along a path within the net of a target via 220A-D from driving source 230. That is, in this embodiment, the relation includes an actual (geographic) distance of the target via from the driving source. Hence, a target via 220A would be prioritized higher than target vias 220B-D because it is closer to driving source 230.

This is in contrast to related art devices in which target vias along a path are simply numbered and prioritized by their numbers, which does not guarantee the distance along the path is the factor analyzed.

"Target via net/subnet characteristic" may include, but is not limited to: a number of vias in a net or subnet, what type of net or subnet the target via is in, a length of the net or subnet, a specifically named net or subnet (i.e., selected because it is known to be especially important to timing), and a function of a total number of vias associated with a given net or subnet either taken alone or as a function of a total length of a specifically named net or subnet, or some other combination. Combinations of subnet timing information, distance of a target via along a path from a driving source and target via net/subnet characteristics can take a variety of forms including, but not limited to other design integrity issues.

Figure 4:
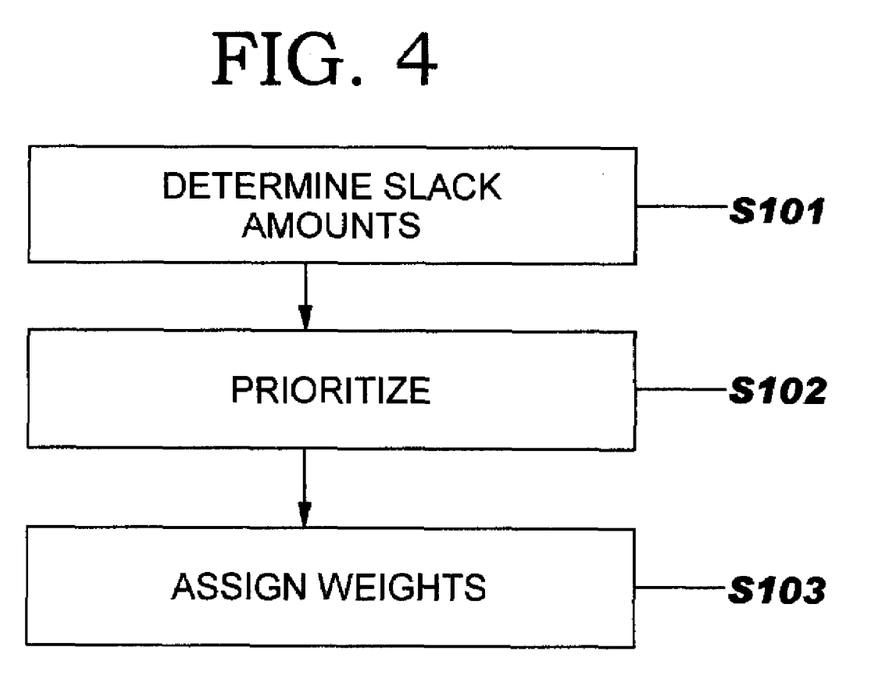
FIG. 4 shows a flow diagram of an alternative embodiment of the invention.

In one illustrative embodiment, prioritization is based on a distance of a particular target via 220A-D along a path from a driving source 230 and a slack amount (timing information) for the subnet of target via 220A-D. The distance includes an actual (geographic) distance of each target via 220A-D to driving source 230. Referring to FIG. 4, a flow diagram illustrating the methodology of this embodiment is shown. FIG. 4 will be described in conjunction with FIGS. 1 and 3. In a first step S101, a slack amount for each of a plurality of subnets of, for example, a particular net of IC design 200 is determined. This step can be accomplished based on data from timing report 202. Next, in step S102, the plurality of subnets are prioritized according to their respective slack amounts by net/subnet timing prioritizer 170. That is, the subnets are sequenced from the least amount of positive slack to the most amount of positive slack, which indicates their relative criticality to IC design 200 performance. The subnet prioritization could be based on "path-based" slack, in which case different subnets within a given net may have different slack values. This would require each via 220A-D to be associated to a subnet. This function also helps in the assignment of weights since the location of branch points within a net is important.

Next, in step S103, a weight is assigned to each target via 220A-D by weight assigner/calculator 172 based on the priority of the subnet to which each target via 220A-D belongs and the distance of the respective target via 220A-D along a path from driving source 230. That is, target vias on the most critical subnet are reviewed first, followed by target vias on lower priority subnets. This review can be accomplished by prioritizer 152 tracing a subnet(s) according to its priority and identifying a distance to driving source 230 for each target via 220A-D on the subnet that is traced. Weight assigner/calculator 172 may calculate a weight in a variety of ways. In one embodiment, the weight for a given target via is calculated as a product of an inverse of the slack amount of a subnet of the given target via and the inverse a distance of the given target via along a path from the driving source 230. Alternatively, for a given target via, e.g., 220B, that is greater than a predetermined distance (user defined) from driving source 230, the weight may be calculated as simply an inverse of the slack amount of the subnet to which the given target via belongs.

Returning to FIGS. 1-3, the next step S3 includes via adder 180 attempting to add a redundant via to each target via 220A-D based on the prioritization. Via adder 180 can take a variety of forms. In one embodiment, via adder 180 may try to add via redundancy to each target via 220A-D in series according to a highest-to-lowest priority. In this case, via adder 180 may include any conventional via redundancy adding system, and the prioritized list of target vias 220A-D would be used to evaluate via insertion instead of using the conventional first-come, first-served technique.

Figure 5:
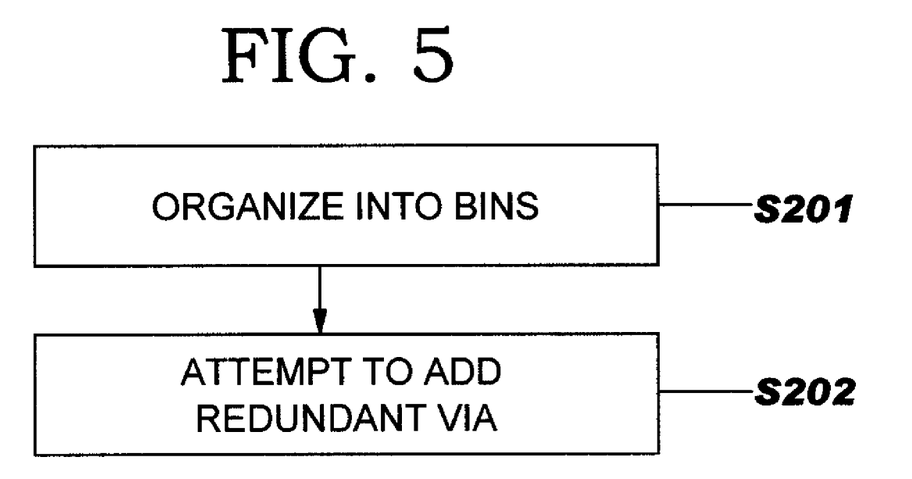
FIG. 5 shows a flow diagram of another alternative embodiment of the invention.
Figure 6:
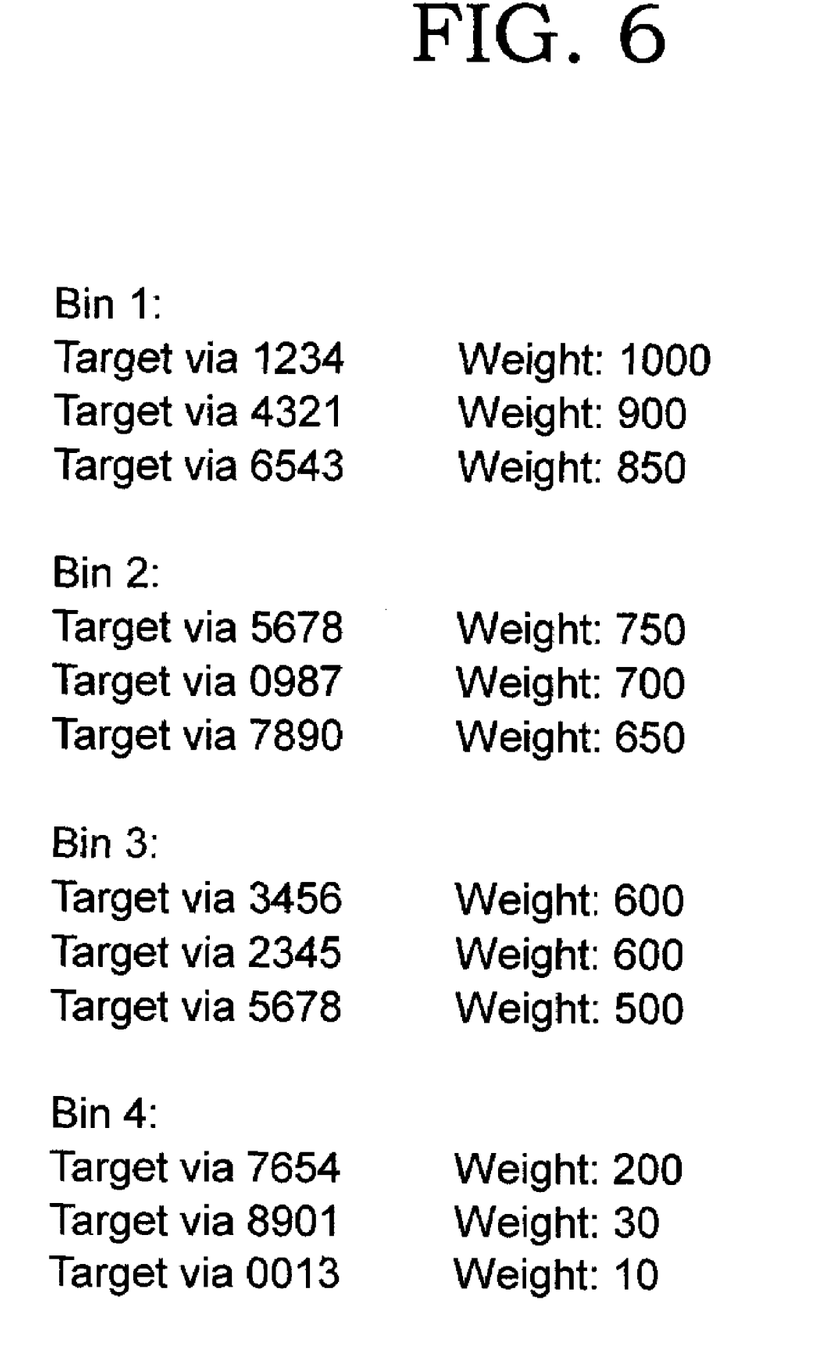
FIG. 6 shows an illustrative bin configuration for the FIG. 5 embodiment.

FIG. 5 shows a flow diagram of an alternative embodiment for attempting to add via redundancy. Referring to FIGS. 1, 3 and 5, in step S201, bin organizer 182 organizes the plurality of target vias 220A-D into bins sequentially according to their respective priorities. The number of bins may be user selected such that a coarser review of target vias 220A-D can be made. FIG. 6 shows an example in which twelve target vias are organized into four bins (25% for each bin coarseness). Each bin 1-4 includes target vias prioritized by their weights from highest to lowest. In step S202, via adder 180 tries to add a redundant via 224 to each target via 220A-D by bins, i.e., first bin 1, then bin 2, and so on, in series according to a highest-to-lowest priority. Again, via adder 180 could be a conventional system that uses the prioritized list (FIG. 6) rather than the first-come, first-served technique.

In an alternative embodiment, the attempting step may include optimizer 184 optimizing via redundancy by evaluating a group of the plurality of target vias 220A-D simultaneously using the priority of each target via 220A-D in determining which target vias 220A-D should have a redundant via 224 added by via adder 180. The optimizer uses the weights as follows. If there are two vias such that adding a new redundant via 224 for either one would prevent the addition of a new redundant via 224 for the other, then the optimizer will automatically use the available space to add a redundant via for the original via of the two having the highest weight. Optimizer 184 may employ techniques as described in U.S. Patent Publication No. US 2005-0048677 A1, entitled THE USE OF A LAYOUT-OPTIMIZATION TOOL TO INCREASE THE YIELD AND RELIABILITY OF VLSI DESIGNS, which is hereby incorporated by reference. In this case, the prioritization of target vias 220A-D would be used directly in the optimization such that optimizer 184 could make the correct trade-offs between vias with different weights. The result would be that if two target vias 220A-D were competing for the same free track for the purpose of acquiring a new redundant via 224 mate, the target via 220A-D with the higher weight would win, and that target via 220A-D would end up with a new redundant via 224 at the expense of the other.

Returning to FIG. 2, an optional step S4 includes prioritizer 152 periodically re-prioritizing the plurality of target vias 220A-D. For example, suppose the single target vias 220A-D have been sorted into four different priority bins. The target vias in the first bin are the ones treated first; followed by the target vias in the second bin, and so on. It may (and often will) be the case that a new redundant via cannot be added to each target via in the first bin. Suppose that the first target via (relative to the driving source) in a critical subnet (a subnet with very little timing slack) is in the first bin, and the second target via is in the second bin. If it is not possible to add a redundant via to that first target via, then it becomes more important to add a redundant via to that second target via. So, as soon as it is determined that a redundant via cannot be added to the first target via, the weight of the second target via is increased by promoting it to the first bin. In this way, periodic re-prioritization of target vias as redundant vias are added can be accomplished based on the ability to add a new redundant via to the target vias.

It is understood that the order of the above-described steps is only illustrative. To this extent, one or more steps can be performed in parallel, in a different order, at a remote time, etc. Further, one or more of the steps may not be performed in various embodiments of the invention.

It is understood that the present invention can be realized in hardware, software, a propagated signal, or any combination thereof, and may be compartmentalized other than as shown. Any kind of computer/server system(s)—or other apparatus adapted for carrying out the methods described herein—is suitable. A typical combination of hardware and software could be a general purpose computer system with a computer program that, when loaded and executed, carries out the respective methods described herein. Alternatively, a specific use computer, containing specialized hardware for carrying out one or more of the functional tasks of the invention (e.g., design system 30), could be utilized. The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form. Furthermore, it should be appreciated that the teachings of the present invention could be offered as a business method on a subscription or fee basis. For example, the system and/or computer could be created, maintained, supported and/or deployed by a service provider that offers the functions described herein for customers. That is, a service provider could offer the functionality described above.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of adding via redundancy within an integrated circuit (IC) design, the method comprising:
   identifying a plurality of target vias by determining which vias in the IC design do not have a redundant via;
   prioritizing each target via based on at least one of the following: subnet timing information, a distance of a target via along a path from a driving source and a target via net/subnet characteristic; and
   adding a redundant via to a target via based on a result of the prioritization;
   wherein the prioritizing includes:
   determining a slack amount for a plurality of subnets;
   prioritizing the respective plurality of subnets according to their respective slack amounts; and
   assigning a weight to each target via based on the priority of the respective subnet to which each target via belongs and the distance of a respective target via along the path from the driving source.

2. The method of claim 1, wherein the weight assigning includes:
   in the case that a given target via is positioned at a distance greater than a predetermined distance from the driving source along the path, calculating the weight for the given target via as an inverse of the slack amount of the subnet to which the given target via belongs; and
   otherwise, calculating the weight for the given target via as a product of an inverse of the slack amount of a subnet of the given target via and the inverse of the distance of the given target via along a path from the driving source.

3. The method of claim 1, wherein the prioritization result using includes adding via redundancy to the plurality of target vias in series according to a highest-to-lowest priority.

4. The method of claim 1, wherein the prioritization result using includes:
   organizing the plurality of target vias into a plurality of bins sequentially according to their respective priority; and
   adding via redundancy to the plurality of target vias by bins in series according to a highest-to-lowest priority; and
   repeating the organizing and adding until no more redundant vias can be added.

5. The method of claim 1, wherein the prioritization result using includes optimizing via redundancy by evaluating a group of the plurality of target vias simultaneously using the priority of each target via in determining which target vias have a redundant via added.

6. The method of claim 1, wherein
   the subnet timing information includes at least one of the following: a slack amount for a subnet of the target via and a path-based slack; and
   the target via net/subnet characteristic includes at least one of the following: a number of vias in a net or subnet, what type of net or subnet the target via is in, a length of the net or subnet, a specifically named net or subnet, and a function of a total number of vias associated with a given net or subnet either taken alone or as a function of a total length of the net or subnet.

7. The method of claim 1, further comprising periodically re-prioritizing the plurality of target vias.

8. A system for adding via redundancy within an integrated circuit (IC) design, the system comprising:
   means for identifying a plurality of target vias within the IC design by determining which vias do not have a redundant via;
   means for prioritizing each target via based on at least one of the following: subnet timing information, distance of a target via along a path from a driving source and a target via net/subnet characteristic; and
   means for adding a redundant via to a target via based on a result of the prioritization;
   wherein the prioritizing means includes:
   means for determining a slack amount for a plurality of subnets;
   means for prioritizing the plurality of subnets according to their respective slack amounts;
   means for tracing a subnet according to its priority and identifying a distance to a driving source for each target via on the subnet; and
   means for assigning a weight to each target via based on the priority of the respective subnet to which each target via belongs and the distance of a respective target via along the path from the driving source.

9. The system of claim 8, wherein the assigning means includes:
   means for, in the case that a given target via is positioned at a distance greater than a predetermined distance from the driving source along the path, calculating the weight for the given target via as an inverse of the slack amount of the subnet to which the given target via belongs; and otherwise, calculating the weight for the given target via as a product of an inverse of the slack amount of a subnet of the given target via and the inverse of the distance of the given target via along a path from the driving source.

10. The system of claim 8, wherein the prioritization result using means includes means for adding via redundancy to the plurality of target vias in series according to a highest-to-lowest priority until no more vias can be added.

11. The system of claim 8, wherein the prioritization result using means includes:
means for organizing the plurality of target vias into bins sequentially according to their respective priorities;
means for adding redundancy to the plurality of target vias by bins in series according to a highest-to-lowest priority; and
means for repeating the organizing and adding steps until no more vias can be added.

12. The system of claim 8, wherein the prioritization result using means includes means for optimizing via redundancy by evaluating a group of the plurality of target vias simultaneously using the priority of each target via in determining which target vias have a redundant via added.

13. The system of claim 8, wherein
the timing information includes at least one of the following: a slack amount for a subnet of the target via and a path-based slack; and
the target via net/subnet characteristic includes at least one of the following: a number of vias in a net or subnet, what type of net or subnet the target via is in, a length of the net or subnet, a specifically named net or subnet, and a function of a total number of vias associated with a given net or subnet either taken alone or as a function of a total net or subnet length.

14. The system of claim 8, wherein the prioritizing means periodically re-prioritizes the plurality of target vias.

15. A program storage device readable by a machine, tangibly embodying a program of instructions executable by the machine to perform a method for adding via redundancy within an integrated circuit (IC) design, the method comprising:
identifying a plurality of target vias in the IC design by determining which vias do not have a redundant via;
prioritizing each target via based on at least one of the following: subnet timing information, a distance of a target via along a path from a driving source and a target via net/subnet characteristic; and
adding a redundant via to a target via based on a result of the prioritization;
wherein the prioritizing includes:
determining a slack amount for a plurality of subnets;
prioritizing the plurality of subnets according to their respective slack amounts; tracing each subnet according to its priority and identifying the distance to a driving source for each target via on each subnet that is traced; and
assigning a weight to each target via based on the priority of the subnet to which each target via belongs and the distance of each target via to the driving source,
wherein the assigning includes: in the case that a given target via is positioned at a distance greater than a predetermined distance from the driving source along the path, calculating the weight for the given target via as an inverse of the slack amount of the subnet to which the given target via belongs; and
otherwise, calculating the weight for the given target via as a product of an inverse of the slack amount of a subnet of the given target via and the inverse of the distance of the given target via along a path from the driving source.

16. The program storage device of claim 15, wherein the timing information includes at least one of the following: a slack amount for a net of the target via and a path-based slack; and
the target via net/subnet characteristic includes at least one of the following: a number of vias in a subnet, what type of net or subnet the target via is in, a length of the net or subnet, a specifically named net or subnet, and a function of a total number of vias associated with a given net or subnet either taken alone or as a function of a total net or subnet length.

17. The program storage device of claim 15, wherein the prioritization result using includes:
adding via redundancy to the plurality of target vias in series according to a highest-to-lowest priority until a via redundancy limit is reached; and
periodically re-prioritizing the plurality of target vias.

* * * * *